United States Patent [19]

Hobrecht et al.

[11] 4,266,254

[45] May 5, 1981

[54] INTEGRATED CIRCUIT FOR RECORDING AND PLAYBACK OF SUCH RECORDING

[75] Inventors: Stephen W. Hobrecht, Sunnyvale, Calif.; Henry M. Skawinski, Craigmount, Hong Kong; Kh Chiu, Kowloon, Hong Kong; Wong Hee, Kowloon, Hong Kong

[73] Assignee: National Semiconductor Corp., Santa Clara, Calif.

[21] Appl. No.: 36,696

[22] Filed: May 7, 1979

Related U.S. Application Data

[63] Continuation of Ser. No. 803,473, Jun. 6, 1977.

[51] Int. Cl.³ .................................................. G11B 15/12
[52] U.S. Cl. ........................................... 360/62; 360/61
[58] Field of Search ............................... 360/61, 62, 63

[56] References Cited

U.S. PATENT DOCUMENTS

| | | | |
|---|---|---|---|
| 3,347,996 | 10/1967 | Uchikoshi | 360/62 |
| 3,810,135 | 5/1974 | Kawakami et al. | 360/62 |
| 3,930,266 | 12/1975 | Okamoto | 360/62 |
| 3,959,817 | 5/1976 | Honjo et al. | 360/62 |
| 4,003,089 | 1/1977 | Maurer | 360/63 |

*Primary Examiner*—Vincent P. Canney
*Attorney, Agent, or Firm*—Harry M. Weiss

[57] ABSTRACT

This disclosure describes a recorder/playback system which utilizes a silicon chip having bipolar transistors. One feature is an integral electronic switching arrangement which permits silent and smooth change from the record to the playback mode and vice versa by operation of an external single pole switch. Other features include a circuit for driving a recording level meter, an automatic audio level control circuit (ALC) and integral voltage and current regulators.

50 Claims, 5 Drawing Figures

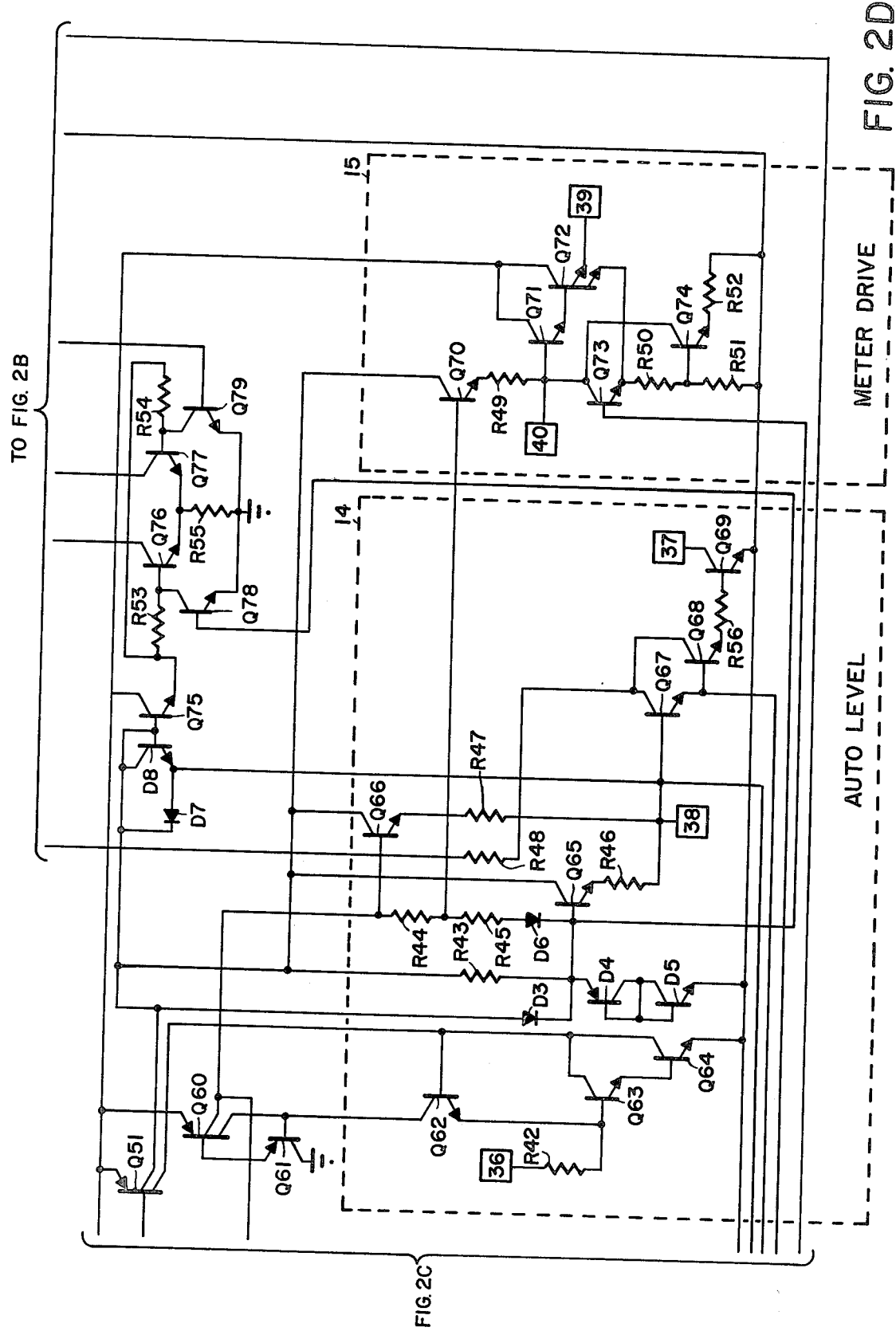

INTEGRATED CIRCUIT FOR RECORDING AND PLAYBACK OF SUCH RECORDING

This is a continuation of application Ser. No. 803,473 filed June 6, 1977.

BACKGROUND OF THE INVENTION

1. Field of the Invention

This invention relates generally to circuits for use in recording and playback system and, more particularly, to semiconductor amplifier circuits designed for use in magnetic tape recording and playback systems.

2. Description of the Prior Art

In the past, it was generally necessary among other things to change from the recording to the playback mode and vice versa by interchanging the input and output terminals of the amplifier. Typically, a six pole double throw switch was required to change;

(a) The input to the preamplifier.
(b) Preamplifier equalization.
(c) The input to the volume control for setting the loud speaker level to a predetermined level to the recording head,
(d) The Automatic Audio Level Control (ALC) (on or off),
(e) The output drive (to the loud speaker amplifier) switched to the recorder head,
(f) The bias oscillator (on or off).

This complicated switching mechanism of prior art record/playback systems has created mechanical and electrical problems.

The voltage gain of an amplifier designed for tape recording and playback is generally between 1000 and 100,000 times. Because of this high gain, there is a necessity for isolating the input and output circuitry of a high gain amplifier to avoid feedback or regeneration which has always presented a design difficulty and was a potential source of electrical or mechanical failure in tape recorders.

As the state of the art in tape recorder system design advanced through the usage of transistors and other miniature components, a point was reached where the prior art playback/record switch mechanism became larger than the amplifier electronics and thus represented a substantial part of the complexity and cost of the recorder system.

It was recognized quite early that the stability of record/playback switching could be improved by grounding the movable elements of the transfer switch (see U.S. Pat. Nos. 2,971,063 to Genning, issued Feb. 7, 1961 and 3,360,615 to Knockenhauer et al. issued Dec. 26, 1967). Electronic switching has also been previously suggested as a desirable alternative to mechanical and electro-mechanical switching arrangements for use in playback/record (P/R) systems (see U.S. Pat. No. 2,853,559 to Leonard, issued Sept. 23, 1958.). However, this prior art patent used a balanced bridge and bulky iron cored components which were costly and sensitive to hum pickup.

Thus, a need existed to provide a single semiconductor chip that would have a simple, reliable P/R switching feature plus other important features such as, for example, a wide range automatic controller of the recording level and an improved metering circuit which assists the operator in preventing tape overload. Voltage regulation circuits to isolate the active electronic circuit portions from the effects of supply voltage and temperature changes were also needed.

SUMMARY OF THE INVENTION

Accordingly, it is an object of this invention to provide an improved, virtually silent, electronic switching circuit to permit changeover from the record to the playback mode of a recording system.

It is another object of this invention to provide an integrated circuit which has an improved, automatic audio level control (ALC) function for use in a recording system.

It is a further object of this invention to provide an improved output meter driving circuit.

It is a still further object of this invention to provide improved voltage regulation circuit functions to assist in isolation of the various other circuit functions and to reduce the effects of supply voltage and temperature changes.

DESCRIPTION OF THE PREFERRED EMBODIMENT

One embodiment of this invention is an integrated circuit which comprises three amplifier blocks, a P/R integrated logic block which is controllable externally according to the D.C. level at the logic input pin, a meter drive block, and an automatic level control (ALC) block.

In accordance with the embodiment of this invention, a playback/record system is described which comprises an integrated circuit containing playback amplifier means for playing back previously recorded material. The circuit also contains recording means for recording material. Furthermore, the circuit includes switching means for selecting between a playback and record mode of operation.

Additionally the circuit includes logic means connected to the switching means for selectively operating one of the playback amplifier means and the recording amplifier means. The logic means comprises first transistor device means for operating the playback amplifier means, second transistor device means for operating the recording amplifier means, and third transistor device means for selecting between the first and the second transistor means. This embodiment is incorporated in a monolithic silicon chip and preferably encased in a 20 pin DIP.

The foregoing and other objects, features and advantages of the invention will be apparent from the following more specific description of circuit functions covering preferred embodiments as illustrated in the accompanying drawings.

BRIEF DESCRIPTION OF THE FIGURES

FIGS. 2A, 2B, 2C and 2D are four parts of a single detailed electrical schematic of the recorder/playback system of FIG. 1 without the external components thereof.

FIG. 1 shows in block and partial schematic form, an IC playback/record system which can be used in a single channel tape recorder. If AC tape head bias is desired, an external bias oscillator, generally referred to as reference numeral 21, is used. Reference numbers 17 through 24 of FIG. 1 also show other external components required to facilitate operation of the chips which are described below. Reference numeral 10, of FIG. 1, is a Source or Recording Amplifier which is a high gain two stage preamplifier suitable for receiving input signals from a dynamic or ceramic microphone Mic. Input 20 or from some other signal source which the user may wish to record.

Figure 1:
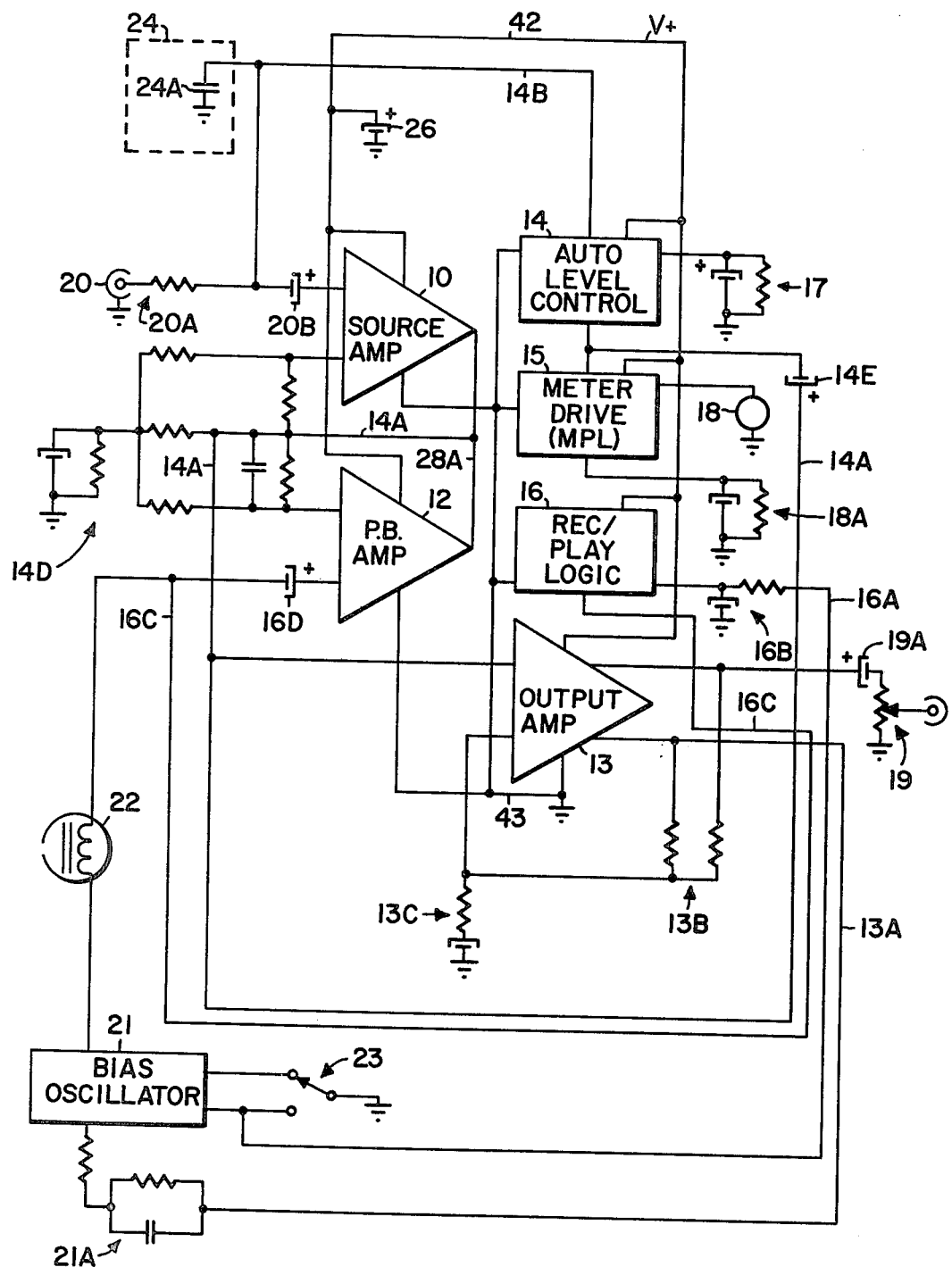
FIG. 1 is a block diagram and partial schematic of a recorder/playback system in accordance with one embodiment of this invention.

Reference numeral 12 of FIG. 1 is a Playback Amplifier which is a medium gain preamplifier that amplifies signals from a Tape Head 22 when the IC system is switched to the playback mode. While not specifically shown in FIG. 1, the Playback Amplifier 12 can also be driven via pad 30 (see FIG. 2A) which can be connected to an external low noise transistor (not shown). Signals from a radio or phonograph pickup can be connected to pad 32 (see FIG. 2B). Both preamplifiers 10 and 12 of FIG. 1 can be used with frequency shaping networks 20A MIC Equalizer and 21A (NAB Equalizer) for equalization and pre-emphasis.

Reference numeral 13 of FIG. 1 is an Output Amplifier which is a medium gain amplifier that accepts input signals from amplifiers 10 and 12, and supplies an amplified output signal through capacitor 19A to volume control for Playback Output 19. Alternatively, an output signal is supplied by the Output Amplifier 13 to the recorder Tape Head 22 via conductor 13A through preemphasis network 21A and the Bias Oscillator 21.

An automatic level controller (ALC) 14 is shown as one block in relation to other circuit functions. The ALC or Auto Level block 14 is connected to the common output of Playback amplifiers 10 and 12 via conductor 14A which serves as an input to the ALC 14. The processed signal of the ALC or Auto Level 14 output which is essentially a rectified and filtered analog of the input source signal envelope is applied via conductor 14B to the input of the source amplifier 10. The dynamic impedance of the ALC 14 output on conductor 14B effectively controls the gain of the Source amplifier 10 by acting as a shunt. Reference numeral 24 shown as the dotted box of FIG. 1 contains a shunt capacitor 24A connected across one input to the Source amplifier 10. The capacitor 24A functions as an optional noise reduction arrangement by increasing the high frequency roll-off when the system gain is at maximum, i.e., when the ALC 14 output impedance is at its maximum. The ALC 14 relaxation time for level control can be adjusted as desired by modifying RC network 17 (ALC Timing Network) which is connected to the Auto Level Control 14.

Reference numeral 15 of FIG. 1 is a Meter Drive or Motional Peak Leveler (MPL) also derives its input signal like ALC 14 via conductor 14A from common output 14C of the preamplifiers 10 and 12. VU (Volume Unit) meter 18 and RC response shaping network 18A are connected to the Meter Drive (MPL) 15.

Reference numeral 16 of FIG. 1 shows the Record/Playback (R/P) switching logic block. R/P switching is accomplished by using the R/P logic 16 to selectively disable either the Source amplifier 10 or the P.B. amplifier 12. R/P changeover or transfer switching is accomplished by operation of an externally mounted single pole, Play/Record switch 23 which is connected to both the Bias Oscillator 21 and to the Rec/Play Logic 16 by conductor 16A. A RC decoupling network 16B is connected to the conductor 16A near the Rec./Play Logic block 16. In the record position of the Play/Record switch 23, the switch 23 grounds the logic input to the Rec./Play Logic 16 and also starts the Bias Oscillator 21. In the Play position of the switch 23, the R/P selector switch 23 grounds one terminal of the Tape Head 22. The other terminal of the Tape Head 22 is connected to one input of the PlayBack Amplifier 12 which is enabled or made operational by lack of a signal carried by conductor 16C from an output of the Rec./Play Logic block 16. Reference numeral 14D is an RC decoupling network connected to both Source and Play Back Amplifiers 10 and 12. The common output of preamplifier 10 and 12 is connected via the conductor 14A to both the ALC 14 and the Meter Drive 15. Reference numeral 13B is a pair of feedback attenuation resistors in the two outputs of the Output Amplifier 13 which are connected to a RC feedback network 13C. Coupling capacitors 16D, 14E and 20B are connected respectively to the P.B. Amp. 12, to the input for both the ALC 14 and Meter Drive 15, and to Source Amp. 10. A filter capacitor 26 (see FIG. 1) is connected to V+ bus 42A (see FIG. 2B) by means of Pad 26P. The V+ bus 42 is also connected, as shown in FIG. 1, to the Source Amplifier 10, P.B. Amplifier 12, Output Amplifier 13, Rec./Play Logic 16, Meter Drive 15, and ALC 14. A ground line 43 (see also FIG. 2) is connected, as shown, to the Source Amplifier 10, P.B. Amplifier 12, Output Amplifier 13, Rec./Play Logic 16, Meter Drive and ALC 14. The ground line 43 is also connected to the substrate of an I.C. chip using the electronics shown in FIG. 2.

FIGS. 2A, 2B, 2C and 2D are four parts of a single detailed electrical schematic diagram of the IC described herein as part of a self contained recording and playback system shown in FIG. 1. The external components of FIG. 1 are not shown in FIG. 2. The IC of FIG. 2A, 2B, 2C, 2D utilizes 80 transistors, 9 diodes, 3 current leakage protectors (transistors without base connectors) and 57 resistors. There are also 8 low value capacitors $C_1$–$C_6$ as part of the IC. Capacitors $C_1$ and $C_2$ and C1A and C2A located in box 10 and 12 are 5 pf MOS capacitors used for frequency compensation. 9 transistors are used directly in the signal path for amplification (boxes 10, 12 and 13 as described below), 12 transistors are used directly in the R/P logic transfer function 16, and 13 transistors are used in the ALC 14 and MPL meter drive 15. The remaining 40 transistors are used for voltage regulation current control and other functions related to signal isolation and circuit stability.

Figure 2A:
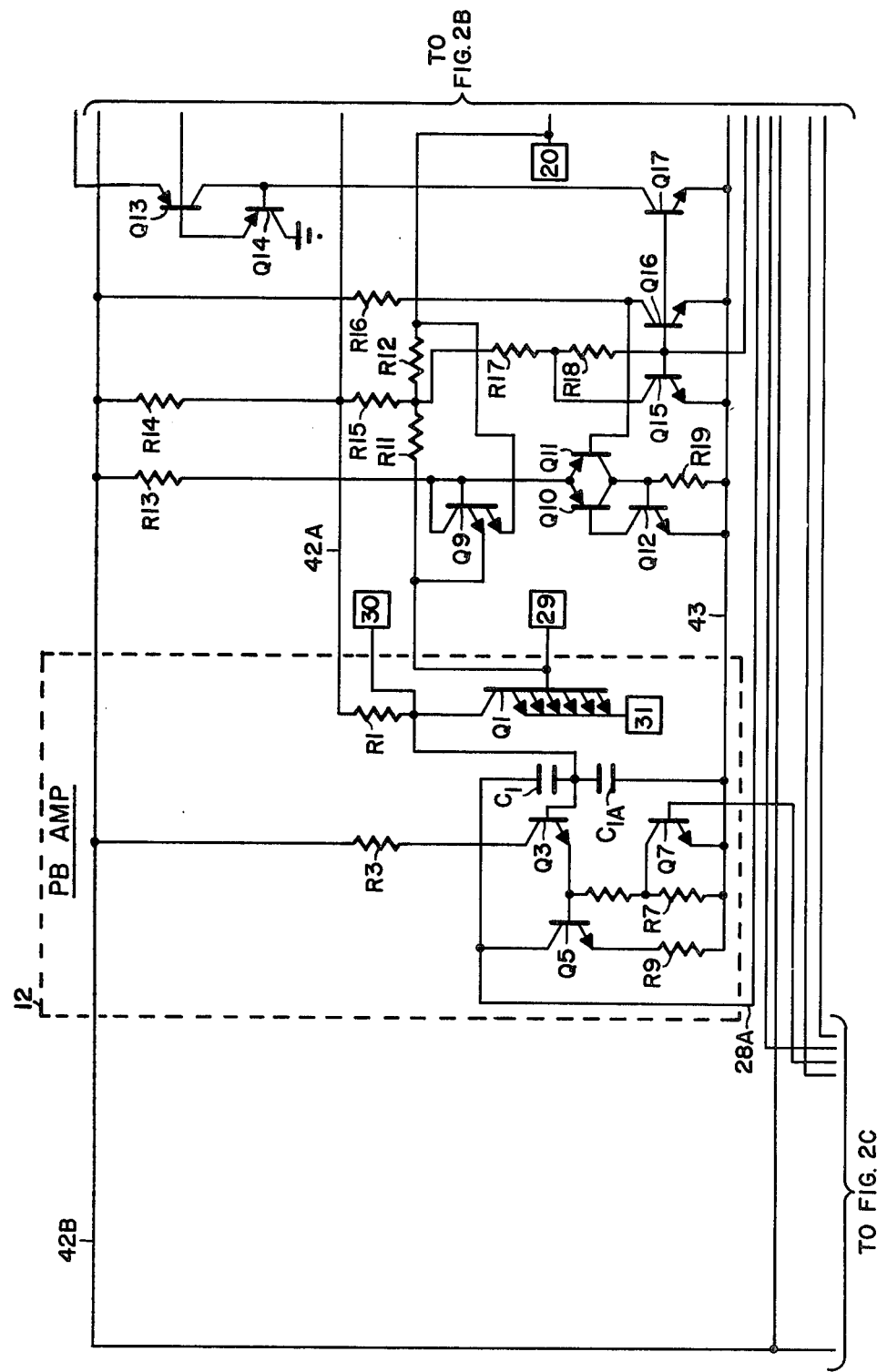
Figure 2B:
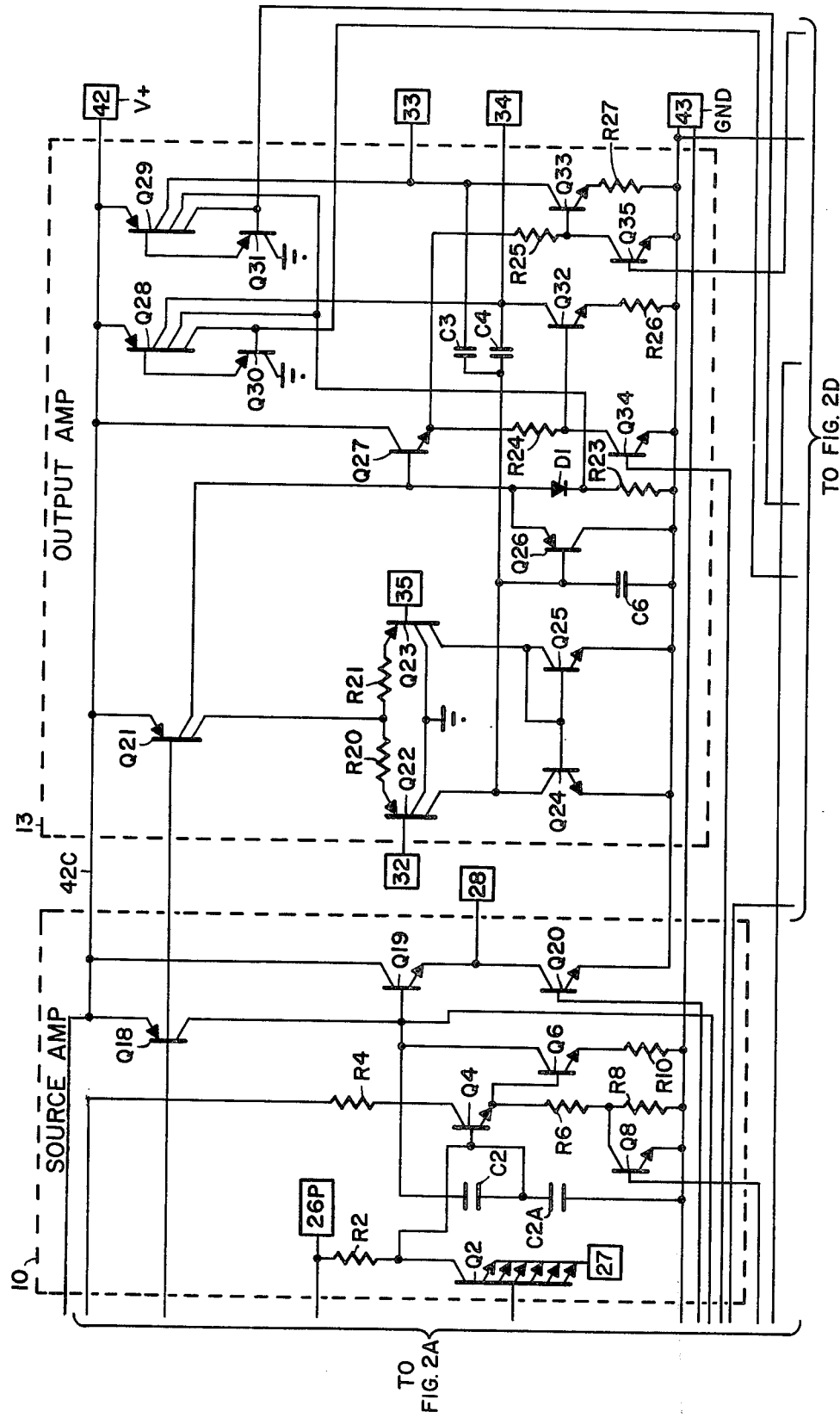
Figure 2C:
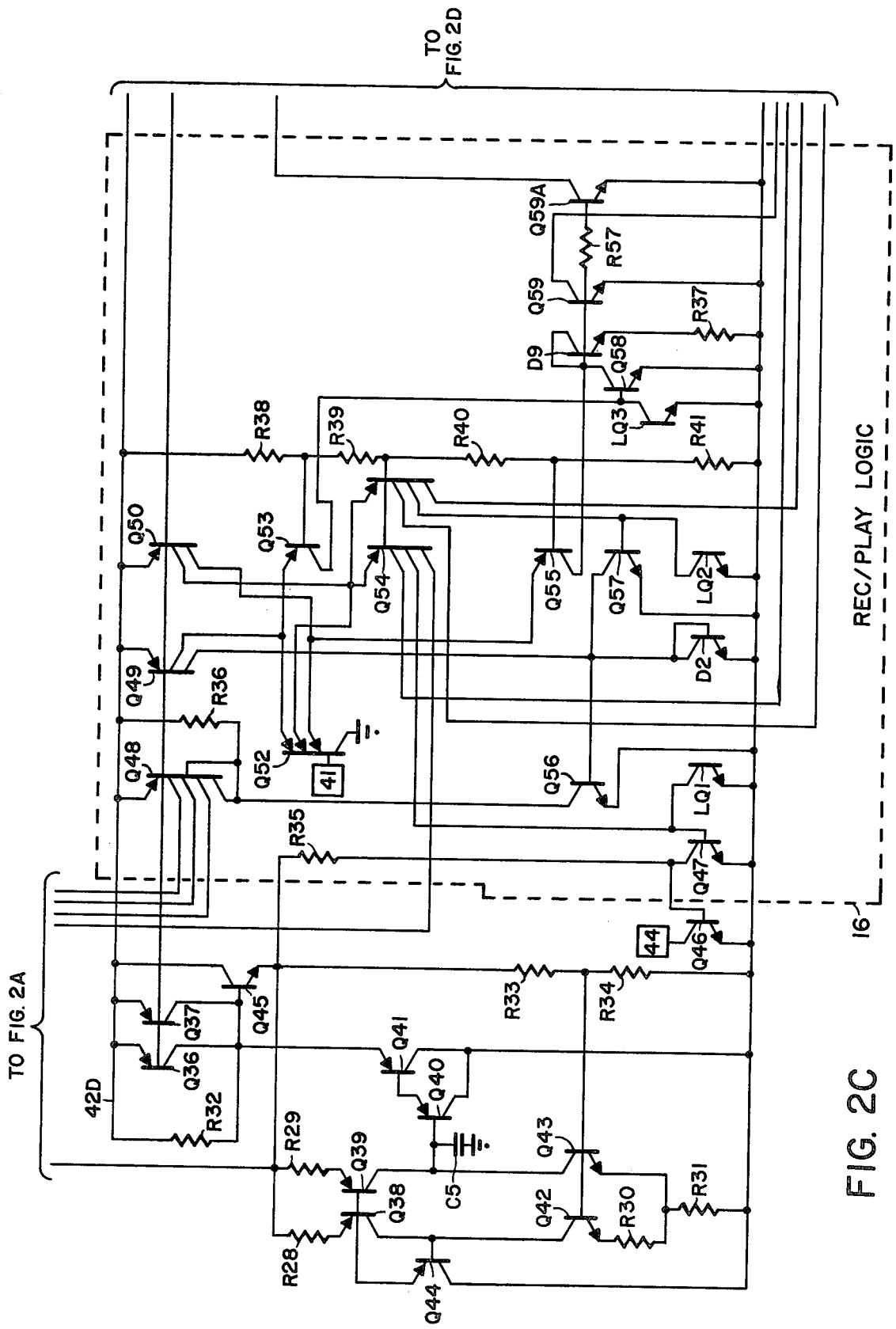

A detailed description of the various components and interconnections of the 1C shown schematically in FIG. 2 follows. Boxes 10, 12, 13, 14, 15 and 16 of FIG. 2A, 2B, 2C, and 2D are the equivalent to the Sound Amplifier 10, P.B. Amplifier 12, Output Amplifier 13, ALC 14, Meter Drive 15 and Rec./Play. Logic 16 of FIG. 1. The transistors of FIG. 2A, 2B, 2C and 2D are all identified by the use of the letter Q followed by a number. The resistors of FIG. 2A, 2B, 2C and 2D are all identified by the use of the letter R followed by a number. Referring to boxes 10 and 12 of FIG. 1, transistors Q1 and Q2 are low-noise, high beta multiple emitter transistor devices used in the input stages of the Playback Amplifier 12 and the Source Amplifier 10. The collector of Q1 is connected to V+ bus 42A through load resistor R1 (33 K ohms). Q1's collector is also connected to the base of transistor Q3. The MOS capacitors $C_1$ and $C_{1A}$ serve as a compensator. The base of Q1 is connected to a Playback input pad 29. The base of Q1 is forward biased through bias resistor R11 (51 K ohms). R11 is connected to the junction of R15 (36 K ohms) and R17 (10 K ohms). Q1's multiple (six are shown)

emitters are connected to a playback feedback pad 31. Q9 comes on when you turn on the circuit. Thus, Q9 quickly charges the input capacitor 20B and 16D, FIG. 1 to bring them up to a level where they are going to be biased under circuit operation.

The collector of Q2 is also connected to V+ bus 42A through load resistor R2 (33 K ohms). V+ bus 42A is also connected to the filter capacitor pad 26P (see FIG. 1) which is provided for connection to the external capacitor 26.

The base of transistor Q2 is connected to the Microphone Input pad 20 (see FIG. 1) which is connected to the Microphone Input 20. The base of Q2 is forward biased by connection to the resistor R12. The emitters of Q2 (six are shown) are connected to the microphone feedback pad 27. The collector of Q2 is also connected to the base of Q4. The capacitors C2, and C2A serve as compensators.

Referring to Box 10, the base of Q3 is connected to the collector of Q1 and the emitter of Q3 is connected to both the base of Q5 and to R5 (4.7 K ohms) which is connected to R7 (42 K ohms) which is in turn connected to the ground line 43. The collector of control transistor Q7 is connected to the junction of R5 and R7. The emitter of control transistor Q7 is connected to the ground line 43. The base of Q7 is connected to one of the four collector leads of Q48 in Box 16. The emitter of Q5 in Box 12 is connected to R9 (200 ohms) which is also grounded to the line 43. The collector of Q3 is connected to a first secondary V+ bus 42B through load resistor R3 (30 K ohms). Q5's collector is connected to the junction between the collector of Q6 and the base of Q19 in Box 10 via conductor 28A.

The primary V+ bus 42C is directly connected to V+ pad 42. The V+ bus 42C and 42D which are connected together are part of the V+ bus 42 of FIG. 1. The primary V+ bus 42C is connected to the emitters of transistors Q18 (Box 10D) and Q21 (Box 13). The bases of Q18 and Q21 are connected together to the base of Q13 and the emitter of Q14. The collector of Q14 is connected to ground and Q14's base is connected to the collector of Q13. The base/collector junction of Q14/Q13 is connected to the collector of Q17. The emitter of Q17 is grounded and its base is connected to the bases of Q16 and Q15. The emitters Q16 and Q15 are also grounded. The base connections to Q15, Q16 and Q17 are connected through R18 (10 K ohms) to the collector of Q15 which is also connected to R17 which is in turn connected to the junction of R11, R12 and R15, a part of the stabilized base voltage supply to Q1 and Q2. Another lead goes from the base connections of Q15, Q16 and Q17 to the base of Q20 in Box 10. The emitter of Q13 is connected to the primary V+ potential bus 42C. R 14 (500 ohms) is connected from the first secondary V+ potential source 42B to the tertiary V+ bus 42A which supplies voltage to the emitters of Q1 and Q2.

The base and collector of transistor Q9 are connected together and then through R13 (5 K ohms) to the first secondary V+ bus 42B. The Q9 base/collector junction is also connected to the emitters of Q10 and Q11. The collectors of Q10 and Q11 are connected to ground line 43 through R19. The collectors of Q10 and Q11 and R19 are connected to the base of Q12. The collector of Q12 is connected to the base of Q10 and Q12's emitter is grounded (line 43). The base of Q11 is connected to the collector of Q16 which is connected through R16 (36 K ohms) to the first secondary V+ bus 42B.

The collector of Q4 in Box 10 is energized by the first secondary V+ bus 42B through load resistor R4. The emitter of Q4 is connected to the base of Q6 and also to ground through R6 (4.7 K ohms) and R8 (42 K ohms). The collector of control transistor Q8 is connected to the junction of R6 and R8. The base of Q8 is connected to the third collector lead of transistor Q54 and the emitter of Q8 (in Box 10) is grounded (line 43.). The collector of transistor Q6 (in Box 10) is connected to the base of Q19 and to the collector of Q18 (both are in Box 10). The emitter of Q6 is connected to ground through R10 (200 ohms). The collector of Q19 is connected to the primary V+ bus 42C. The emitter of Q19 is connected to the collector of Q20 and to preamp. output pad 28.

Differentially connected dual collector transistors Q22 and Q23 form the input section of the Output Amplifier 13 (Box 13). The base of Q22 is connected to amplifier input pad 32. The emitter of Q22 is connected to one collector lead of Q21 through resistor R20 (10 K ohms). The base of Q23 is connected to a feedback pad 35. The emitter of Q23 is also connected to the same collector lead of Q21 through resistor R21 (10 K ohms). One collector lead of Q22 and Q23 is connected to ground. the second collector lead of Q22 is connected to the collector of Q24. The emitters of Q24/Q25 are connected to ground. The base of Q24 is connected to the base and collector of Q25 and to the second collector lead of Q23. The junction between the second collector of Q22 and the collector of Q24 is connected to the base of Q26. Capacitor C3 (5 pf) is connected from the base of Q26 to output pad 33 and capacitor C4 (5 pf) is connected from the base of Q26 to output 34. Capacitor C6 is connected from the base of Q26 to ground line 43.

The collector of Q26 is connected to ground line 43. The emitter of Q26 is connected to the base of Q27 and to the other one of the dual collector leads of Q21. The emitter of Q26 is also connected to the anode of diode D1. The cathode of diode D1 is connected to ground through R23 (24 K ohms). The cathode of D1 is also connected to the second collector lead of the triple collector lead of transistor Q28 and to the second collector lead of the triple collector lead of transistor Q29. The collector of Q27 is connected to the primary V+ bus 42C. The emitter of Q27 is connected to the base of Q32 through R24 (30 K ohms) and to the base of Q33 through R25 (30 K ohms). The collector of Q32 is connected to the first collector lead of multi-collector transistor D28 and to the output pad 34. The emitter of Q32 is connected to ground through R26 (200 ohms). The third collector lead of Q28 is connected to the base of Q30 and to the collector of Q76. The emitter of Q30 is connected to the base of Q28 and the emitter of Q28 is connected to the primary V+ bus 42C. The collector of Q33 is connected to the first collector lead transistor Q29 and to the output pad 33. The emitter of Q33 is connected to ground through resistor R27 (200 ohms). The third collector lead of transistor Q29 is connected to the base of Q31 and to the collector of Q77. The collector of Q31 is connected to ground and the emitter is connected to the base of Q29. The emitter of Q29 is connected to the primary V+ bus 42C.

The collector of control transistor Q34 in Box 13 is connected to the junction of R24 and the base of Q32. The emitter of Q34 is connected to ground and its base is connected to the second collector lead of multi-collector transistor Q48 (Box 16). The collector of control transistor Q35 is connected to the junction of R25 and the base of Q33. The emitter of Q35 is connected to ground and its base is connected to the fourth collector lead of transistor Q54 (Box 16).

The base of transistor Q76 (whose collector is connected to the collector/base leads of Q28/Q30 is connected to the collector of Q78 and one end of R53 (10 K ohms). The emitter of Q78 is connected to ground and the base is connected to the sixth collector lead of transistor Q54. The other end of R53 is connected to the emitter of Q75 and to one end of R54 (10 K ohms). The collector of Q75 is connected to second secondary V+ bus 42D which is energized by the emitter of Q51 whose base is connected to the common bases of Q13, Q18 and Q21. The emitters of Q18 and Q21 are connected to the primary V+ bus 42C.

The emitters of Q76, Q77 are connected to ground through resistor R55 (4.7 K ohms). The base of transistor Q77 (whose collector is connected to the third collector lead of Q29 and the base of Q31) is connected to R54 and the collector of Q79. The emitter of Q79 is connected to ground and its base is connected to the first collector lead of transistor Q48. The base of Q75 is connected to the base and collector of diode connected transistor D8. The emitter of D8 is connected to the anode of diode D7. The cathode of D7 is connected to the second secondary V+ bus 42D. The junction of D8 emitter and D7 anode is connected to the ALC timing pad 38, the base of transistor Q67 and the collector of transistor Q59. The ALC timing pad 38 is also connected to the emitter of Q66 through R47 (1 K ohms) and to the emiter of Q65 through R46 (1 K ohms). The collectors of Q65 and Q66 are connected to the second secondary V+ bus 42D.

The base and collector of the diode connected transistor D8 and the base of Q75 are connected to the first collector lead of dual collector transistor, Q51 and to the anode of diode D3. The cathode of D3 is connected to the junction of R43 (27 K ohms), the cathode of D6, the base of Q65 and the base of Q73.

Diode connected transistors D4 and D5 are connected from the junction of D3, D6, R43, Q65 and Q73 to ground to clamp the voltage at this junction to a predetermined value. The other end of R43 is connected to the second secondary V+ bus 42D. The anode of diode D6 is connected to the first collector lead of Q60 through resistors R45 (6.7 K ohms) and R44 (800 ohms). The first collector lead of Q60 is also connected to the collector of Q59 in Box 16. The base of Q59A is connected to the base of Q59, D9, and the collectors of Q58 and Q55 through R57 (10 K ohms). The emitters of Q59 and Q59A are connected to ground. The emitter of D9 is connected to ground through R37 (1.2 K ohms). The base of Q58 is connected to ground through current leaker LQ3 and is also connected to the collector of Q53 in Box 16. The base of transistor D60 is connected to the emitter of Q61. The collector of Q61 is connected to ground. The second collector lead of Q60 is connected to the base of Q61 and to the collector of Q62. The emitter of Q62 is connected to the base of Q63 and to the ALC audio input pad 36, through R42 (2 K ohms).

The collector of Q63 is connected to the collector of Q64, to the base of Q62, and to the second collector lead of Q51. The base of Q51 is connected to the bases of Q50, Q49, Q37 and Q36. The emitters of Q51, Q50, Q49, Q37 and Q36 are all connected to the second secondary V+ bus 42D. The emitter of Q64 is connected to ground. The collectors of Q67 and Q68 are connected to the first secondary V+ bus 42B through R48 (1 K ohms). The emitter of Q67 is connected to the base of Q68 and to the first collector lead of transistor Q54. The emitter of Q68 is connected through R56 (100 ohms) to the base of Q69. The emitter of Q69 is connected to ground and its collector is connected to ALC output pad 37.

The base of Q70 is connected to the junction of R44, R45. The collector of Q70 is connected to the second secondary V+ bus 42D. The emitter of Q70 is connected to the base of Q71, to the collectors of Q73 and Q74 and to the meter timing connection pad 40, through resistor R49 (200 ohms).

The collectors of Q71 and Q72 are connected to the second secondary V+ bus 42D. The emitter of Q71 is connected to the base of dual emitter transistor Q72. One emitter of Q72 is connected to the VU meter output pad 39 and the other emitter of Q72 is connected to the emitter of Q73 which is connected to ground through R50 (6.2 K ohms) and R51 (9.1 K ohms). The base of Q74 is connected to the junction of R50 and R51. The emitter of Q74 is connected to ground through R52 (2 K ohms).

Resistors R38 (7.5 K ohms), R39 (5 K ohms), R40 (5 K ohms) and R41 (7.5 K ohms in Box 16) form a voltage divider network which is connected from the second secondary V+ bus 42D to ground within the Record/Playback Logic circuit shown in Box 16. The base of Q53 is connected to the junction of R38 and R39. The emitter of Q53 is connected to the first collector lead of dual collector transistor Q49 and the first emitter lead of triple emitter transistor Q52. The collector of Q53 is connected to the base of Q58 and the emitter of current leaker LQ3. The base of transistor Q54 is connected to the junction of R39 and R40. The emitters of transistor Q54 are connected to the second emitter lead of triple emitter transistor Q52 and are also connected to the first collector lead of dual collector transistor Q50.

The base of Q56 is connected to the second collector lead of dual collector transistor Q49, to the collector of Q57 and to the base/collector connection of diode connected transistor D2. The emitters of D2 and Q57 (as well as LQ2) are grounded. As previously stated, the base of Q57 is connected to the fifth collector lead of transistor Q54 and to the collector of current leaker LQ2. The base of transistor Q47 is connected to the second collector lead of transistor Q54 and the collector of current leaker LQ1. The collector of Q47 is connected to the base of Q46 and to the first secondary V+ bus 42B through R35 (5 K ohms). The emitter of Q46 is grounded and its collector is connected to control output pad 44.

The base of triple emitter control transistor Q52 is connected to the R/P Logic input pad 41. The collector of Q52 is grounded and, as previously described, the first emitter lead is connected to the emitter of Q53 and to the first collector lead of Q49. The second emitter lead of Q52 is connected to the emitters of Q54 and to the first collector lead of Q50. The third emitter lead of Q52 is connected to the emitter of Q55 and to the second collector lead of Q50.

The first collector lead of transistor Q54 is connected to the emitter/base junction of Q67/Q68. The second collector lead of Q54 is connected to the base of Q47 and the collector of current leaker LQ1. The third collector lead of Q54 is connected to the base of Q8. The fourth collector lead of Q54 is connected to the base of transistor Q35 in Box 13. The fifth collector lead of Q54 is connected to the base of Q57 and to the collector of current leaker LQ2. The sixth collector lead of Q54 is connected to the base of Q78. The base of Q55 in Box 16 is connected to the junction of R40 and R41. The emitter of Q55 is connected to the second collector lead of dual collector transistor Q50 and to the third emitter lead of triple emitter transistor Q52. The collector of Q55 is connected to the collector of Q58 and to the bases of D9, Q59 and Q59A.

Q48 is a transistor with four collectors. The first collector lead of Q48 is connected to the base of Q79. The second collector lead of Q48 is connected to the base of Q34. The third collector lead of Q48 is connected to the base of Q7. The fourth collector lead of Q48 is connected to its own base. The base of Q48 is also connected to the second secondary V+ bus 42D through R36 and to the collector of Q56.

Resistors R33 (2.54 K ohms) and R34 (2 K ohms) are connected as a voltage divider between the first secondary V+ bus 42B and ground. The junction of R33 and R34 is connected to the bases of transistors Q42 and Q43. The emitter of Q42 is connected to ground through resistors R30 (360 ohms) and R31 (3 K ohms). The emitter of Q43 is connected to the junction of R30 and R31. The collector of Q42 is connected to the collector of Q38 and to the base of Q44. The collector of Q43 is connected to the collector of Q39 and to the base of Q40. Capacitor C5 (10 pf) is connected between the junction of the Q39/Q43 collectors and the base of Q40 is connected to ground. The bases of Q38 and Q39 are connected to the emitter of Q44. The collector of Q44 is grounded. The emitters of Q38 and Q39 are connected to the first secondary V+ bus 42B through R28 (1 K ohms) and R29 (1 K ohms). The collectors of Q40 and Q41 are grounded. The emitter of Q40 is connected to the base of Q41. The emitter of Q41 is connected to the base of Q45, to the collectors of Q36 and Q37, and to one end of R32 (100 K ohms). The other end of P32 is connected to the second secondary V+ bus 42D. The emitter of Q45 is connected to the first secondary V+ bus 42B and the collector of Q45 is connected to the second secondary V+ bus 42D.

The bases of transistors Q36 and Q37 are connected to the bases of Q49, Q50 (in Box 16) and Q51, which as already mentioned, are connected to the bases of Q13, Q18 (in Box 10) and Q21 (in Box 13). The emitters of Q36 and Q37 are connected to the second secondary V+ bus 42D as are the emitters of Q48, Q49, Q50 (in Box 16) Q13 and Q51.

EXPLANATION OF THE VARIOUS FUNCTIONS OF THE IC

Referring to FIG. 1, the system illustrated therein shows one possible interconnection arrangement with a number of external components incorporated as part of the system. From the specification and schematic of FIGS. 2A, 2B, 2C and 2D, it can be observed that with the exception of the interconnection on line 28A (from the common pad 28) of the output of the Source 10 and Playback 12 amplifiers, the various pads on the chip are not interconnected and allow for independent external connection. This permits considerable latitude in the choice of transducers, signal sources and output arrangements to be used with the disclosed Record/Playback system.

The following is a brief explanation of the function of the three amplifiers 10, 12, and 13 and the three auxiliary functions 14, 15, and 16 incorporated in the system of the invention.

SOURCE AMPLIFIER 10

In FIG. 2B, Box 10, shows the components and internal connections of the Source Amplifier 10 indicated as the Source Amp. 10 block of FIG. 1. The signal path is from the Mic. Input Pad 20 via Q2, Q4, Q6, Q19 to the preamp output pad 28. The enable/disable function required for R/P selection is exercised via Q8 acting on signal transistor Q4. Transistor Q8 must be turned off to turn on transistor Q4. The Source amplifier 10 requires a fairly large external filter/decoupling capacitor 26 (see FIG. 1) connected to the filter capacitor pad 26P (of FIG. 2). The microphone feedback network may include external frequency shaping elements should be connected between the microphone feedback pad 27 and pad 28.

Box 12 of FIG. 2A shows the components and internal connections of the Play Back Amplifier 12 which is also shown as block 12 of FIG. 1. The signal path is from the playback input pad 29 via transistors Q1, Q3 and Q5 to (using conductor 28A) Q19 of the Source amplifier (Box) 10 to the preamp output pad 28. This is in accordance with the diagram of FIG. 1 which shows the outputs of amplifiers 10 and 12 connected in parallel by means of conductor 28A. Input pad 32, Box 13 of FIG. 2B, can also be used for connection to a radio/phonograph (not shown) or other higher level signal sources, if desired. The emitters of Q1 are connected to the playback feedback pad 31, which permits connection to a frequency shaping network and feedback connection between the Q1 emitters and pad 28. Enable/disable bias as required for R/P switching is applied to the emitter of Q3 and base of Q5 by transistor Q7 which is turned on by transistor Q48 of the Record/Playback Logic 16.

OUTPUT AMPLIFIER 13

Block 13 of FIG. 2B shows the components and internal connections of the Output Amplifier 13 of FIG. 1. The signal path through the Output Amplifier 13 is from the amplifier input pad 32 to transistor Q22, to Q26, to Q27, and thence to either Q33 and output pad 33 or to Q32 and output pad 34. The either/or status of Q32 and Q33 depends on whether Q34 or Q35, respectively, is biased into conduction by the R/P Logic 16. Transistor Q22 connected to at the amplifier input pad 32 forms a differential amplifier in conjunction with Q23. The base of Q23 is connected to feedback input pad 35 to facilitate introduction of negative feedback (see 13B of FIG. 1) into the Output Amplifier 13C. Transistors Q22, Q24 and Q23, Q25 are connected as PNP/NPN complementary pairs and the signal derived from the collectors of Q22/Q24 is fed to the base of Q26. The emitter of PNP Q26 drives the base of Q27 whose emitter is connected to the bases of Q32 and Q33 through 30 K ohm resistors R24 and R25. The function of the 30 K ohm resistors R24 and R25 is to effectively isolate Q32 from Q33 and to assure that Q34 or Q35 when either is biased into conduction will effectively eliminate the signal at the base of either Q32 or Q33, respectively.

Thus, the Output Amplifier 13 performs a dual function. In the Record mode it provides a low impedance signal source at a level suitable for driving the Tape recording Head (see 22 of FIG. 1) and in its playback mode it supplies enough of a signal level to an external volume control (see 19 of FIG. 1) to permit satisfactory operation of an external power amplifier and loud speaker (not shown). It is also necessary that outputs (pads 33 and 34) of the Output Amplifier 13 be completely decoupled in either operating mode. When Q34 is on, then Q33 is enabled and pad 33 is working. When Q35 is on then Q32 is enabled and pad 34 is working. Q76 or Q77 also turn "off" and "on" to provide a biasing current for Q32 or Q33 respectively.

AUTO LEVEL CONTROL (ALC) 14

Box 14 of FIG. 2D shows the components and internal connections of the Automatic Level Controller (ALC) 14. This corresponds to the Auto Level Control (ALC) block 14 shown in FIG. 1. The ALC 14 derives its input signal from the audio input pad 36 (see FIG. 2). The signal path in the ALC 14 is via R42, to the Darlington pair Q63/Q64, which are collector coupled to the base of Q62, thence to Q61 and Q60. The first collector lead of Q60 drives the base of Q66 whose emitter is connected to the base of Q67 (part of Darlington pair Q67/Q68) through R47.

The emitter of Q66 feeds the Darlington pair Q67/Q68 which drive the base of Q69. Q69 is the shunt transistor (connected to ALC output pad 37) which controls the input impedance of the Source amplifier 10 at the microphone input pad 20 by means of conductor 14B (see FIG. 1). To adjust the time constant of the ALC 14, it is necessary to connect an external RC network (see 17 of FIG. 1) from the ALC timing pad 38 to ground.

METER DRIVE (MPL) 15

Box 15 of FIG. 2D shows the components and internal connections of the portion of the IC circuit designed for driving the recording level meter 18 of FIG. 1. This circuit portion corresponds to the block 1 marked Meter Drive (MPL) reference numeral 15 of FIG. 1. The Meter Drive circuit portion 15 obtains its operating signal from the junction of R44 and R45 (in the Auto Level Box 14) to the base of transistor Q70 in the Meter Drive Box 15.

The emitter of transistor Q70 drives the Darlington pair Q71/Q72. The first emitter lead of Q72 is connected to the IC meter output pad 39. The overall attack and decay speed of the recording meter 18 can be adjusted by connecting the RC network 18A (see FIG. 1) from the meter timing pad 40 to ground. The Meter total response varies as the audio level drives the recording Meter Drive 15 toward full scale. This is defined as the Motional Peak Level (MPL) feature. The MPL feature is created by Q73 and Q74, the collectors of which are connected to the base of Q71. The base of transistor Q73 receives a DC reference signal from the base of Q65 located in the ALC Box 14. The base of Q74 is connected to the mid-point of a voltage divider R50, R51 in the emitter circuit of Q73. The second emitter lead of the dual emitter transistor Q72 is connected to the emitter of Q73.

RECORD/PLAYBACK LOGIC 16

Box 16 of FIG. 2C, shows the components and internal connections of the logic circuit portion for changing from the Record to Playback function and vice versa. Box 16 of FIG. 2C corresponds to the block labeled Record/Playback Logic, reference numeral 16 of FIG. 1. The enabling signal for the Record function is initiated by grounding the Record/Playback logic input pad 41, which grounds the base of the multi-emitter PNP transistor Q52 that drives Q54 and Q55 into cut-off. Transistor Q54 when turned on causes Q8 to conduct which allows the playback amplifier 12 to operate. Another collector of Q54 causes Q35 to conduct and disable output pad 33 of the Output Amplifier 13. Conduction in transistor Q52, initiated by grounding its base, also cuts off transistor Q48 because of the phase reversal by Q56. When Q48 is not conducting, Q7 (in the Play Back Amplifier 12) does not conduct, thus enabling the Playback (P.B.) amplifier 12. Conduction in Q48 which does all the switching for the record operation, also turns on Q34 in the Output Amplifier 13. When Q34 is on, then Q33 is enabled and pad 33 is working. If Q54 is turned off, it keeps Q57 off and current source Q49A is then allowed to supply current to diode and transistor Q56 which drives Q48 into conduction. When the R/P logic input pad 41 is open, the base of Q52 is open, current source transistor Q50 supplies current to Q54 and Q54 functions to divide up the current. In the playback mode of operation Q54 is "on". When Q52 is "on" it acts as a current sink for transistor Q50 and thereby turns off Q54. Non-conduction in Q54 also cuts off Q35 in the Output Amplifier 13, rendering output pad 33 operational. Referring to FIG. 2D, Q78 and Q79 are also control transistors. One of these two control transistors is "on" for the record mode of operation. The other one is "on" for the playback mode of operation.

While the invention has been particularly shown and described with reference to the preferred embodiments above, it will be understood by those skilled in the art that the foregoing and other changes in the form and details may be made therein without departing from the spirit and scope of the invention.

What is claimed is:

1. In a playback/record magnetic tape recorder system, a single tape head, an integrated electronic switching circuit comprising audio playback amplifier means coupled to said single tape head for playing back previously recorded audio material, audio recording amplifier means coupled to said single tape head for recording audio material, single single pole switching means for selecting between playback and record modes of operation, and logic means connected to said single pole switching means for selectively operating one of said audio playback amplifier means and said audio recording amplifier means, said logic means comprising first transistor device means for operating said audio playback amplifier means, second transistor device means for operating said audio recording amplifier means, and third transistor device means for selecting between said first and said second transistor device means.

2. The electronic switching circuit of claim 1 wherein said first transistor device means comprising a PNP transistor device having multiple collector leads.

3. The electronic switching circuit of claim 1 wherein said second transistor device means comprising a PNP transistor device having plural collector leads.

4. The electronic switching circuit of claim 1 wherein said third transistor device means comprising a PNP transistor device having multiple emitter leads.

5. The electronic switching circuit of claim 1 wherein said first transistor device means comprising a PNP transistor device having multiple collector leads, said second transistor device means comprising a PNP transistor device having plural collector leads, said third transistor device means comprising a PNP transistor device having multiple emitter leads.

6. The electronic switching circuit of claim 2 wherein one of said multiple collector leads of said PNP transistor device of said first transistor device means being connected to said audio playback amplifier means.

7. The electronic switching circuit of claim 3 wherein one of said multiple collector leads of said PNP transistor device of said second transistor device means being connected to said audio recording amplifier means.

8. The electronic switching circuit of claim 4 wherein one of said multiple emitter leads being connected to said second transistor device means and another one of said multiple emitter leads being coupled to said first transistor device means.

9. The electronic switching circuit of claim 8 including a PNP device having plural collector leads connected to said third transistor device means, said another one of said multiple emitter leads being connected to one of said plural collector leads to said PNP device connected to said third transistor device means, a NPN transistor device connected to said PNP device connected to said third transistor device means, said NPN transistor device connected to said first transistor device means.

10. The electronic switching circuit of claim 9 wherein the base of said NPN transistor device being connected to another of said plural collector leads of said PNP device connected to said third transistor device means, the collector of said NPN transistor device being connected to said first transistor device means.

11. The electronic switching circuit of claim 10 wherein the collector of said NPN transistor device being connected to said first transistor device means between the collector and base portions of said first transistor device means.

12. The electronic switching circuit of claim 11 wherein one of said multiple collector leads of said PNP transistor degvice of said first transistor device means being connected to said audio playback amplifier means, and one of said multiple collector leads of said PNP transistor device of said second transistor device means being connected to said audio recording amplifier means.

13. The electronic switching circuit of claim 1 including output amplifier means for amplifying the signals received from one of the audio playback amplifier means and the audio recording amplifier means.

14. The electronic switch circuit of claim 13 including means for simultaneously selecting and activating one of the combinations of said audio playback amplifier means with said output amplifier means and said audio recording amplifier means with said output amplifier means.

15. The electronic switching circuit of claim 13 wherein said means for simultaneously selecting and activating comprising said first transistor device means connected to said audio playback amplifier means and said output amplifier means for simultaneously selecting and activating said audio playback amplifier means with said output amplifier means, said means for simultaneously selecting and activating also comprising said second transistor device means for simultaneously selecting and activating said audio recording amplifier means with said output amplifier means.

16. The electronic switching circuit of claim 15 wherein said first transistor device means comprising a PNP transistor device having multiple collector leads.

17. The electronic switching circuit of claim 15 wherein said second transistor device means comprising a PNP transistor device having plural collector leads.

18. The electronic switching circuit of claim 15 wherein said first transistor device means comprising a PNP transistor device having multiple collector leads, and said second transistor device means comprising a PNP transistor device having plural collector leads.

19. The electronic switching circuit of claim 15 wherein said third transistor device means comprising a PNP transistor device having multiple emitter leads.

20. The electronic switching circuit of claim 19 wherein said first transistor device means comprising a PNP transistor device having multiple collector leads, and said second transistor device means comprising a PNP transistor device having plural collector leads.

21. The electronic switching circuit of claim 15 wherein said first transistor device means comprising a PNP transistor device having multiple collector leads, and one of said multiple collector leads of said PNP transistor device of said first transistor device means being connected to said audio playback amplifier means, and another of said multiple collector leads of said PNP transistor device of said first transistor device means being connected to said output amplifier means.

22. The electronic switching circuit of claim 15 wherein said second transistor device means comprising a PNP transistor device having plural collector leads, one of said multiple collector leads of said PNP transistor device of said second transistor device means being connected to said audio recording amplifier means, and another of said multiple collector leads of said PNP transistor device of said second transistor device means being connected to said output amplifier means.

23. The electronic switching circuit of claim 13 wherein said output amplifier means comprising differentially controlled output means for providing one output signal on one of two separate output terminals.

24. The electronic switching circuit of claim 23 wherein said first transistor device means comprising a PNP transistor device having multiple collector leads, said second transistor device means comprising a PNP transistor device having plural collector leads, said differentially controlled output means comprising a pair of separate NPN control transistor devices, the base of one of said pair of separate NPN control transistor devices being connected to one of said multiple collector leads of said PNP transistor device of said first transistor device means, the base of the other of said pair of separate NPN control transistor devices being connected to one of said multiple collector leads of said PNP transistor device of said second transistor device means.

25. The electronic switching circuit of claim 24 wherein one of said multiple collector leads of said PNP transistor device of said first transistor device means being connected to said audio playback amplifier means.

26. The electronic switching circuit of claim 24 wherein one of said multiple collector leads of said PNP transistor device of said second transistor device means being connected to said audio recording amplifier means.

27. The electronic switching circuit of claim 25 wherein one of said multiple collector leads to said PNP transistor device of said second transistor device means being connected to said audio recording amplifier means.

28. The electronic switching circuit of claim 1 including automatic level control means for reducing the output signal of said audio recording amplifier means.

29. The electronic switching circuit of claim 28 wherein said automatic level control means comprising transistor device means for providing a variable impedance across the input of said audio recording amplifier means.

30. The electronic switching circuit of claim 29 wherein said variable impedance transistor device means comprising a NPN transistor device having the base connected to the output from said audio recording amplifier means.

31. The electronic switching circuit of claim 28 including RC network means connected to said automatic level control means for modifying the response time of said automatic level control means.

32. The electronic switching circuit of claim 28 including shunt capacitor means connected to said automatic level control means for noise suppression for said playback/record system.

33. The electronic switching circuit of claim 1 including meter drive means for indicating the audio level during operation of said audio recording amplifying means.

34. The electronic switching circuit of claim 33 wherein said meter drive means comprising transistor device means for progressively modifying the meter response in accordance with the signal received from said audio recording amplifying means.

35. The electronic switching circuit of claim 34 wherein said transistor device means comprising a pair of NPN transistor devices, the base of one NPN transistor device being coupled to the emitter of the other NPN transistor device, the collector of said one NPN transistor device being connected to the collector of said other NPN transistor device.

36. The electronic switching circuit of claim 1 including output amplifier means for amplifying the signals received from one of the audio playback amplifier means and the audio recording amplifier means, and meter drive means for indicating the audio level during operation of said audio recording amplifying means.

37. The electronic switching circuit of claim 1 including output amplifier means for amplifying the signals received from one of the audio playback amplifier means and the audio recording amplifier means, and automatic level control means for reducing the output signal of said audio recording amplifier means.

38. The electronic switching circuit of claim 1 including automatic level control means for reducing the output signal of said audio recording amplifier means, and meter drive means for indicating the audio level during operation of said audio recording amplifying means.

39. The electronic switching circuit of claim 1 including output amplifier means for amplifying the signals received from one of the audio playback amplifier means and the audio recording amplifier means, automatic level control means for reducing the output signal of said audio recording amplifier means, and meter drive means for indicating the audio level during operation of said audio recording amplifying means.

40. The electronic switching circuit of claim 39 including means for simultaneously selecting and activating one of the combinations of said audio playback amplifier means with said output amplifier means and said audio recording amplifier means with said output amplifier means.

41. The electronic switching circuit of claim 40 wherein said means for simultaneously selecting and activating comprising said first transistor device means connected to said audio playback amplifier means and said output amplifier means for simultaneously selecting and activating said audio playback amplifier means with said output amplifier means, said means for simultaneously selecting and activating also comprising said second transistor device means for simultaneously selecting and activating said audio recording amplifier means with said output amplifier means.

42. The electronic switching circuit of claim 39 wherein said first transistor device means comprising a PNP transistor device having multiple collector leads.

43. The electronic switching circuit of claim 39 wherein said second transistor device means comprising a PNP transistor device having plural collector leads.

44. The electronic switching circuit of claim 39 wherein said first transistor device means comprising a PNP transistor device having multiple collector leads, and said second transistor device means comprising a PNP transistor device having plural collector leads.

45. The electronic switching circuit of claim 39 wherein said first transistor device means comprising a PNP transistor device having multiple collector leads, said second transistor device means comprising a PNP transistor device having plural collector leads, and said third transistor device means comprising a PNP transistor device having multiple emitter leads.

46. The electronic switching circuit of claim 39 including means for simultaneously selecting and activating one of the combinations of said audio playback amplifier means with said output amplifier means and said audio recording amplifier means with said output amplifier means, said automatic level control means comprising transistor device means for providing a variable impedance across the input of said audio recording amplifier means, and said meter drive means comprising transistor device means for progressively modifying the meter response in accordance with the signal received from said audio recording amplifying means.

47. The electronic switching circuit of claim 46 wherein said means for simultaneously selecting and activating comprising said first transistor device means connected to said audio playback amplifier means and said output amplifier means for simultaneously selecting and activating said audio playback amplifier means with said output amplifier means, said means for simultaneously selecting and activating also comprising said second transistor device means for simultaneously selecting and activating said audio recording amplifier means with said output amplifier means, said first transistor device means comprising a PNP transistor device having multiple collector leads, said second transistor device means comprising a PNP transistor device having plural collector leads, said third transistor device means comprising a PNP transistor device having multiple emitter leads, said variable impedance transistor device means comprising a NPN transistor device having the base connected to the output from said audio recording amplifier means, and said transistor device means comprising a pair of NPN transistor devices, the base of one NPN transistor device being coupled to the emitter of the other NPN transistor device, the collector of said one NPN transistor device being connected to the collector of said other NPN transistor device.

48. In a playback/record magnetic tape recorder system, a single tape head, an integrated electronic switching circuit comprising audio playback amplifier means coupled to said single tape head for playing back previously recorded audio material, audio recording amplifier means coupled to said single tape head for recording audio material, single single pole switching means for selecting between playback and record modes of operation, and logic means connected to said single pole switching means for selectively operating one of said audio playback amplifier means and said audio recording amplifier means, output amplifier means for amplifying the signals received from one of the audio playback amplifier means and the audio recording amplifier means, and automatic level control means for reducing the output signal of said audio recording amplifier means.

49. In a playback/record magnetic tape recorder system, a single tape head, an integrated electronic switching circuit comprising audio playback amplifier means coupled to said single tape head for playing back previously recorded audio material, audio recording amplifier means coupled to said single tape head for recording audio material, single single pole switching means for selecting between playback and record modes of operation, and logic means connected to said single pole switching means for selectively operating one of said audio playback amplifier means and said audio recording amplifier means, output amplifier means for amplifying the signals received from one of the audio playback amplifier means and the audio recording amplifier means, automatic level control means for reducing the output signal of said audio recording amplifier means, and meter drive means for indicating the audio level during operation of said audio recording amplifying means.

50. In a playback/record magnetic tape recorder system, a single tape head, an integrated electronic switching circuit comprising audio playback amplifier means coupled to said single tape head for playing back previously recorded audio material, audio recording amplifier means coupled to said single tape head for recording audio material, single single pole switching means for selecting between playback and record modes of operation, and logic means connected to said single pole switching means for selectively operating one of said audio playback amplifier means and said audio recording amplifier means, output amplifier means for amplifying the signals received from one of the audio playback amplifier means and the audio recording amplifier means, and meter drive means for indicating the audio level during operation of said audio recording amplifying means.

* * * * *